United States Patent
Gerhäußer

(10) Patent No.: US 9,648,722 B2
(45) Date of Patent: May 9, 2017

(54) PCB EMBEDDED POWER MODULE

(71) Applicant: HS Elektronik Systeme GmbH, Nördlingen (DE)

(72) Inventor: Thomas E. Gerhäußer, Westheim (DE)

(73) Assignee: Elektronik Systeme GmbH, Nordlingen (DE)

( * ) Notice: Subject to any disclaimer, the term of this patent is extended or adjusted under 35 U.S.C. 154(b) by 220 days.

(21) Appl. No.: 14/597,695

(22) Filed: Jan. 15, 2015

(65) Prior Publication Data
US 2015/0223320 A1    Aug. 6, 2015

(30) Foreign Application Priority Data
Jan. 31, 2014  (DE) .................. 10 2014 101 238

(51) Int. Cl.
| | |
|---|---|
| H05K 7/00 | (2006.01) |
| H05K 1/02 | (2006.01) |
| H05K 1/03 | (2006.01) |
| H05K 1/18 | (2006.01) |
| H05K 3/30 | (2006.01) |
| H01L 23/538 | (2006.01) |

(Continued)

(52) U.S. Cl.
CPC ......... *H05K 1/0207* (2013.01); *H01L 21/486* (2013.01); *H01L 23/49833* (2013.01); *H01L 23/5389* (2013.01); *H05K 1/0373* (2013.01); *H05K 1/181* (2013.01); *H05K 1/185* (2013.01); *H05K 1/186* (2013.01); *H05K 3/303* (2013.01); *H01L 2224/04105* (2013.01); *H01L 2224/18* (2013.01); *H01L 2224/2518* (2013.01); *H01L 2224/32225* (2013.01); *H01L 2224/48091* (2013.01); *H01L 2224/48137* (2013.01); *H01L 2224/48227* (2013.01); *H01L 2224/48472* (2013.01); *H01L 2224/73265* (2013.01); *H01L 2224/73267* (2013.01); *H01L 2224/83192* (2013.01); *H01L 2224/92144* (2013.01); *H01L 2924/15153* (2013.01); *H01L 2924/181* (2013.01); *H05K 3/4611* (2013.01); *H05K 2201/0209* (2013.01); *H05K 2201/10166* (2013.01); *Y10T 29/4913* (2015.01)

(58) Field of Classification Search
CPC . H01L 2224/32225; H01L 2224/48091; H01L 2224/48227; H01L 2224/73265; H01L 2924/181; H01L 2924/00; H01L 2924/00012; H01L 2924/00014; H01L 21/486; H01L 2224/04105; H01L 2224/18; H01L 2224/2518
See application file for complete search history.

(56) References Cited

U.S. PATENT DOCUMENTS

| | | | |
|---|---|---|---|
| 5,444,297 A * | 8/1995 | Oshima | H01L 23/5383 257/660 |
| 6,359,331 B1 * | 3/2002 | Rinehart | H01L 23/642 257/691 |

(Continued)

FOREIGN PATENT DOCUMENTS

DE    102011083223    3/2013

*Primary Examiner* — Yuriy Semenenko
(74) *Attorney, Agent, or Firm* — Snell & Wilmer L.L.P.

(57) ABSTRACT

A printed circuit board assembly comprises a printed circuit board having at least one conductive layer supported by a substrate layer, and at least one power semiconductor device, wherein the at least one power semiconductor device is at least partly embedded in the substrate layer.

13 Claims, 5 Drawing Sheets

(51) Int. Cl.
*H01L 23/498* (2006.01)
*H01L 21/48* (2006.01)
*H05K 3/46* (2006.01)

(56) References Cited

U.S. PATENT DOCUMENTS

| | | | | |
|---|---|---|---|---|
| 8,441,806 | B2* | 5/2013 | Tsukada | H01L 23/142 |
| | | | | 174/258 |
| 9,025,341 | B2* | 5/2015 | Kawanami | H01L 25/072 |
| | | | | 361/783 |
| 2009/0140399 | A1* | 6/2009 | Schulz | H01L 23/041 |
| | | | | 257/660 |
| 2011/0128707 | A1* | 6/2011 | Rozman | H01L 23/24 |
| | | | | 361/709 |
| 2012/0020044 | A1* | 1/2012 | Iihola | H01L 21/4828 |
| | | | | 361/783 |
| 2014/0042604 | A1* | 2/2014 | Jeon | H01L 23/49827 |
| | | | | 257/676 |
| 2015/0092376 | A1* | 4/2015 | Arens | H01L 21/56 |
| | | | | 361/767 |

* cited by examiner

PCB EMBEDDED POWER MODULE

CROSS-REFERENCE TO RELATED APPLICATIONS

This application claims priority from German Patent Application No. 10 2014 101 238.0 entitled "PCB Embedded Power Module" filed on Jan. 31, 2014, which is incorporated herein by reference in its entirety.

FIELD OF INVENTION

The present disclosure relates to a printed circuit board assembly, in particular for use with power semiconductor modules. Power semiconductor modules of that type may be suitable for use in power conversion in a vehicle, in particular in an aircraft.

BACKGROUND OF THE INVENTION

Power semiconductor modules are devices for converting and controlling the flow of electric energy and are used as inverters, DC/DC converters, and other power conversion devices. Power semiconductor modules are widely used in homes, industries, automobiles, aircraft, wherever power must be converted or controlled. Power semiconductor devices, including diodes, thyristors, power MOSFETS and IGBTs, are typically assembled to form power semiconductor modules, which may contain several such power semiconductor devices.

Controlling and converting power in power semiconductor devices of the type described above produces significant heat. This heat will increase the temperature of the power semiconductor module to the point of failure of the power semiconductor devices. Therefore, efficient heat management is a main requirement for electrical equipment using power semiconductor devices of this type. For this reason, power semiconductor devices used in typical applications like aircraft power conversion typically are based on silicon carbide SiC which has better thermal characteristics than mere silicon based power devices. SiC based power devices may operate up to temperatures as high as 250° C. and produce less heat than corresponding silicon based devices. However, even for SiC based power devices efficient transfer of heat away from the semiconductor device is a main requirement.

US 2011/0128707 A1 discloses a power semiconductor module suitable for power conversion on aircraft. In this power module, heat producing SiC power semiconductor devices, like MOSFET or IGBT, are mounted to a substrate using Chip on Board technology. The power semiconductor module includes an insulating substrate with a conductive circuit layer attached to one side. Power semiconductor devices are attached to the conductive circuit layer by soldering. The power semiconductor devices are wire bonded to each other and to the conductive circuit layer to form a power conversion circuit. The power semiconductor devices as well as the wire bonds are embedded in a soft casting "Globtop" compound protecting the circuitry and preventing short circuiting of the wire bonds. A base plate is attached the side of the insulating substrate opposing the power semiconductor devices. Heat generated in the power semiconductor devices by the power conversion is conducted away from the power semiconductor devices first through the conductive circuit layer, then through the insulating substrate, to the baseplate which dissipates the heat by thermal contact with a heat transfer fluid, e.g. air.

DE 10 2011 083 223 A1 describes another power semiconductor module suitable for power conversion by bridge circuits including MOSFETs or IGBTs. The power semiconductor module is made up of two printed circuit boards each including an insulating substrate layer sandwiched in between an upper metallization layer and a lower metallization layer. The two printed circuit boards are vertically stacked upon each other with a gap formed in between the lower metallization layer of the upper board and the upper metallization layer of the lower board. A power semiconductor chip is disposed in the gap and is electrically conductively connected to the metallization layers.

While the Globtop configuration described in US 2011/0128707 A1 provides for sufficiently effective heat dissipation in a number of applications, it requires considerable mounting space and is prone to failures, particular with respect to the wire bonds. Moreover, testing for failures can be done after final assembly of the power module only, i.e. in a situation where wire bonding has been finished and the components are embedded by the Globtop casting. The configuration shown in DE 10 2011 083 223 A1 avoids a number of wire bonds, but requires relatively sophisticated handling of the printed circuit boards to position the semiconductor chip precisely in the gap. Moreover, the power semiconductor module still requires significant space.

Therefore, it would be beneficial to have an improved configuration for a power semiconductor module allowing more efficient assembly and/or better utilization of space while still providing sufficient heat dissipation capability.

SUMMARY OF THE INVENTION

One aspect relates to a printed circuit board assembly, comprising a printed circuit board having at least one conductive layer supported by a substrate layer, and at least one power semiconductor device. The at least one power semiconductor device is at least partly embedded in the substrate layer. The power semiconductor device particularly may be a power semiconductor die. The printed circuit board assembly may be used to build up a power semiconductor chip module adapted to be mounted to a circuit board, e.g. by Surface Mount Technology (SMT) or Through-Hole Mount Technology.

According to a further aspect, the invention relates to a method of manufacturing a printed circuit board assembly comprising a printed circuit board having at least one conductive layer supported by a substrate layer, and at least one power semiconductor device, the method comprising: Embedding the at least one power semiconductor device at least partly in the substrate layer of the printed circuit board in the course of manufacturing the printed circuit board.

BRIEF DESCRIPTION OF THE DRAWINGS

The invention will be described in more detail in the following with respect to the accompanying figures, in which.

DETAILED DESCRIPTION

Figure 1:
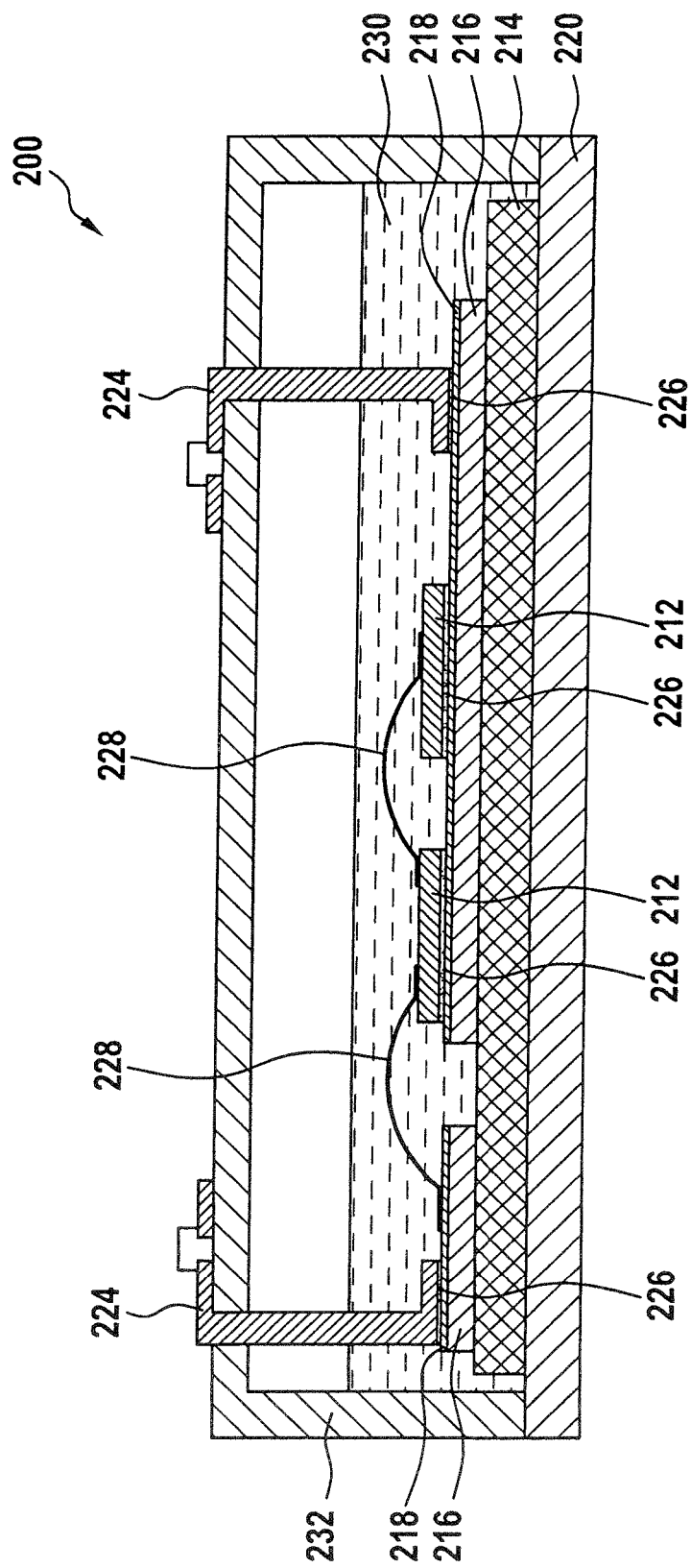
FIG. 1: shows a cross-sectional view of a conventional power semiconductor printed circuit board assembly using Globtop technology.

FIG. 1 is a cross-sectional view of a first embodiment of a conventional a power semiconductor printed circuit board assembly 200. The conventional a power semiconductor printed circuit board assembly 200 includes a plurality of power semiconductor devices 212, an insulating substrate 214, a conductive circuit layer 216, a solderability enhancing layer 218, a baseplate 220, load current contacts 224, circuit contact solder connections 226, wire-bonds 228, a soft casting compound 230, and a plastic housing 232. The power semiconductor devices 212 are SiC based power semiconductor devices. The insulating substrate 214 is formed of a material that is electrically insulating and highly thermally conductive. The solderability enhancing layer 218 is formed of a material that is electrically conductive and compatible with solder attachment, for example, nickel.

The power semiconductor devices 212 are physically and electrically attached to conductive circuit layer 126 by Chip-on-Board technology using circuit solder connections 226 and solderability enhancing layer 218. The conductive circuit layer 216 is bonded to a first side of the insulating substrate 214 and the baseplate 220 is bonded to a second side of the insulating substrate 214 opposite the first side of the insulating substrate 214. The baseplate 220 is in contact with a moving fluid, for example, air, cooling gas or liquid. The wire bonds 228 connect the power semiconductor devices 212 to each other and to sections of the conductive circuit layer 216 such as to form a power circuit. The load current contacts 224 penetrate plastic housing 232 and are attached to conductive circuit layer 216 by circuit contact solder connections 226 and solderability enhancing layer 218. The soft casting compound 230 forms a Globtop applied to surround and contain the power semiconductor devices 212, wire bonds 228, conductive circuit layer 216, solderability enhancing layer 218, circuit solder connections 226, and insulating substrate 214. The soft casting compound 230 also contains a portion of load current contacts 224 and is held in place by the plastic housing 232.

In operation, power is conducted through the load current contacts 224 to the conductive circuit layer 216 through circuit solder connections 216 and solderability enhancing layer 218. The power is converted or controlled by the power semiconductor devices 212 functioning together through the interconnections provided by the conductive circuit layer 216 and wire bonds 228. The soft casting compound 230 (globtop) prevents wire bonds 228 from shorting to each other, to conductive circuit layer 216, or to load current contacts 224. The soft casting compound 230 also protects the wire bonds 228 from harmful vibration which, if unchecked, can cause failure of the connections between the wire bonds 228 and the power semiconductor devices 212 and between the wire bonds 228 and the conductive circuit layer 216.

Heat is generated by the power control and conversion process is conducted away from the power semiconductor devices 212 through the conductive circuit layer 216 to the insulating substrate 214 and then through the insulating substrate 214 to the baseplate 220.

FIGS. 2A to 2D show a printed circuit board assembly 10 according to a first embodiment in various stages of its manufacturing process. The representation in FIGS. 2A to 2D is simplified and merely schematic. Dimensions indicated in the Figs. are not intended to reflect dimensions in reality. In particular, dimensions in direction across the layers are shown in enlarged scale to better demonstrate the principles. The same considerations apply to FIGS. 3A to 3D.

Figure 2A:
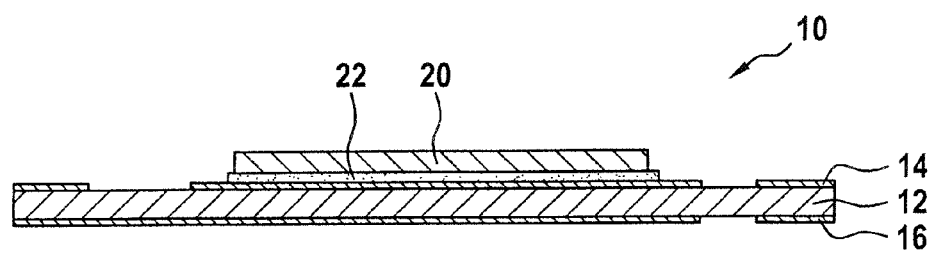
FIGS. 2A-2D show cross sectional views of a power semiconductor printed circuit board assembly according to a first embodiment.

FIG. 2A shows a first stage of the manufacturing process. A first core layer 12 supporting a first conductive layer 14 on its upper side and a second conductive layer 16 on its lower side is provided. The first core layer 12 is made from an insulating material, e.g. a plastics material or a plastics/fiber composite as commonly used for substrates of printed circuit boards. For a more detailed description of potential materials for the core layer 12 see the description given further below. The first and/or second conductive layers 14, 16 are made of electrically conductive material, typically copper. Other metallic materials may be used as well, in particular alloys from Ni and Cu. The first and second conductive layers may be provided with a patterning in order to provide electrical and/or thermal contacts to the power semiconductor device 20 as required. The conductive layer 16 on the bottom side of the first core layer 12 does not have a particular technical function in the context of building up the printed circuit board assembly 10 according to the embodiment, and may be omitted. On the other hand, it may be convenient to use a prefabricated printed circuit board comprising core layer 12 supporting first conductive layer 14 and second conductive layer 16 on both surfaces. Moreover, a symmetrical structure of first core layer supporting electrically conductive layers on both of its surfaces typically is preferable with respect to mechanical properties.

A power semiconductor device 20 is attached to the upper conductive layer 14 of core layer 12 via a solder or electrically conductive adhesive 22. The power semiconductor device 20 particularly may be a "naked" semiconductor die, as set out in more detail further below. The power semiconductor device 20 includes electrical power devices based on semiconductor structures like MOSFETs, IGBTs, power diodes, Schottky-diodes, or the like, as used for electric power conversion circuits. The bottom side of power semiconductor device 20 is electrically and/or thermally contacted to the upper conductive layer 16 of core 12 via solder/conductive adhesive 22.

As shown in FIG. 2A, only the bottom side of the power semiconductor device 20 is embedded by the core layer 12 via conductive layer 14 and solder/adhesive 22. The other sides of the power semiconductor device 20 still remain exposed in this stage of the manufacturing process.

Figure 2B:
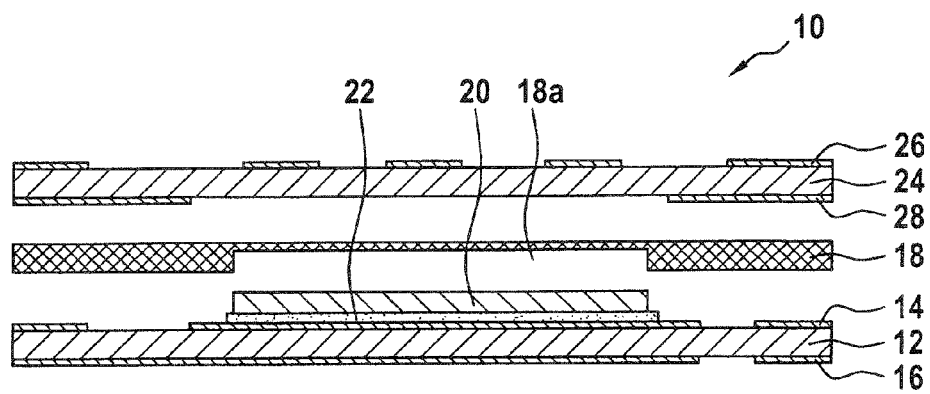

FIG. 2B shows that in a next step in the manufacturing process a laminating layer 18 is applied. Laminating layer 18 is stacked on top of first core layer 12, thus contacting the conductive layer 14 supported by core layer 12. Laminating layer 18 has the configuration of a prepreg made of a prepreg material as typically used in manufacturing of semiconductor packages for laminating different layers of multilayer packages to each other. Laminating layer 18 is solid under normal environmental conditions, but softens when elevated temperature and/or elevated pressure is applied, and solidifies again once the elevated temperature/pressure conditions are relieved. Typical prepreg materials used for the laminating layer 18 are listed further below. Laminating layer 18 is precut such as to form a cavity 18a opening to the bottom side of laminating layer 18. Cavity 18a corresponds to the shape of semiconductor device 20 such that semiconductor device 20 is accommodated in cavity 18a once the laminating layer 18 is laid on top of the assembly formed by core layer 12 with semiconductor device 20 attached to it. Pre-cutting of the laminating layer 18 such as to form cavity 18a allows a close contact of laminating layer 18 to semiconductor device 20 already before the lamination process is started by applying elevated temperature/pressure, and therefore helps to closely embed power semiconductor device 20 in the substrate layer of the PCB after laminating layer 18 has been laminated to core layer 12 and conductive layer 14. In some cases, softening characteristics of the laminating layer 18 under elevated temperature/pressure may be sufficient to allow embedding of the exposed surfaces of semiconductor device 20 in the lamination layer without precutting of the lamination layer 18.

Above the lamination layer 18, a second core layer 24 is stacked. Core layer 24 in this embodiment also supports conductive layers 26, 28 on both of its surfaces. Hence, laminating layer 18 is laminated to conductive layer 28 supported on the lower surface of second core layer 24. However, similar to conductive layer 16 supported on the lower surface of the first core layer 12, conductive layer 28 supported on the lower surface of second core layer 24 does not have any particularly important function with respect to lamination of the substrate layer in this embodiment, and therefore may be dispensed. It may be helpful to additionally provide conductive layer 28 made from a suitable material, e.g. as an Invar layer allowing to adjust the coefficient of thermal expansion of the substrate layer. Invar is an alloy of Ni and Fe having a particularly low coefficient of thermal expansion. Typically, Invar has a composition Fe64Ni36.

Figure 2C:
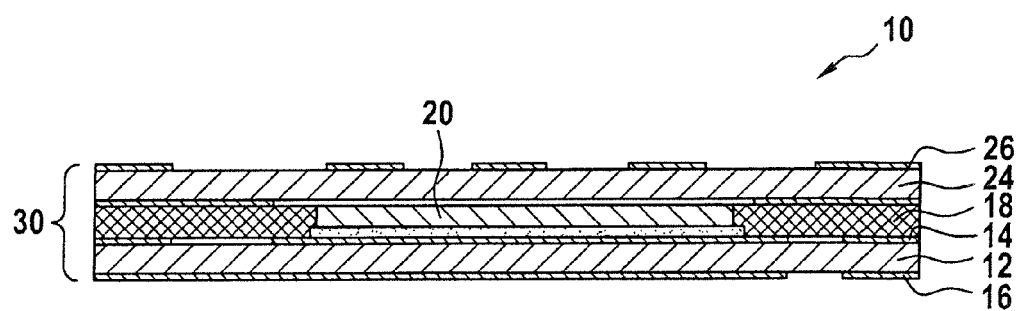
Figure 2D:
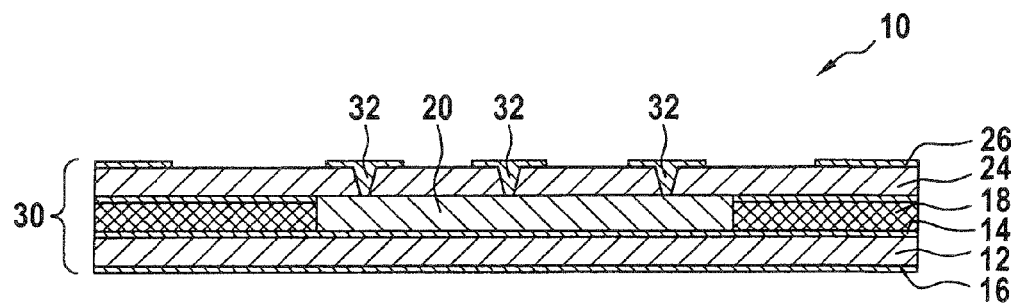

First core layer 12, second core layer 14 and lamination layer 18 together form the substrate layer of the PCB in this embodiment, as indicated by the reference numeral 30 in FIGS. 2C and 2D. As can be seen in FIG. 2C which shows a stage just after the lamination process has been finished, all the surfaces of the power semiconductor device 20 are in closely embedded in the first core layer 12 (via electrically conductive layer 14) or in the laminating layer 18. While it is convenient to apply second core layer 24, as shown in the embodiment, in some applications it may be sufficient to only embed the power semiconductor device 20 by the first core layer 12 and the lamiting layer 18.

In the stage shown in FIG. 2C, the power semiconductor device 20 is electrically contacted only by its lower side via the electrically conductive layer 14. Usually, it will be desirable to also provide electrical and/or thermal contacts to the upper side of the power semiconductor device 20, e.g. via the electrically conductive layer 16 supported on the upper surface of second core layer 24. As shown in FIG. 2D, a number of vias 32 may be provided in the substrate layer of the PCB to establish such electrical and/or thermal connections. The vias 32 may be formed by plating or filling conductive material, e.g. copper, into blind holes drilled into the substrate material formed by the laminating layer 18 and the second core layer 24. Drilling of blind holes for vias in the range of millimeters may be done by mechanical drilling, e.g. using tungsten carbide bits. In the embodiment shown, the vias 32 are drilled using laser radiation based drilling technology, as typically used for drilling holes for "microvias", i.e. vias having very small diameters in the submillimeter range, e.g. diameters of 0.15 mm, or smaller (e.g. diameters of 0.1 mm). In the context of the embodiment, using laser radiation for drilling holes into the substrate layer is advantageous not only for drilling small diameter holes typical for microvias, but also for drilling much larger holes with diameters of several millimeters. Typically, laser radiation is less preferred for drilling such large holes, but in the present embodiment is convenient since laser radiation may be applied with a well defined wavelength and there are a wide range of laser wavelengths available. Depending on wavelength, laser absorption characteristics are different for electrically conductive materials (as used for connecting pads of a semiconductor die), on the one hand, and for insulating materials typically used for the substrate layer of the PCB, on the other hand. This allows to select the wavelength of the laser radiation used for drilling the via holes such that there is efficient absorption of the laser radiation by the substrate material, but there is virtually no absorption of the laser radiation by the electrically conductive pads of the power semiconductor device 20 at positions where electrical contacts are provided. Thereby, the laser radiation by itself provides for an exactly defined depth of the blind holes.

Vias of the type described above may also be used for heat management of the power semiconductor device 20 by conducting heat away from the power semiconductor device 20 to thermally conductive layers. Filling the vias with a material having good thermal conductivity (e.g. copper) allows an efficient transport of heat away from the power semiconductor device 20 towards efficient heat sinks. Moreover, to enhance heat transfer a number of additional vias may be provided designed for transfer of heat exclusively, in which case there does not need to be an electrically conductive connection to the power semiconductor device 20 by these additional vias. In cases where an electrically conductive layer 26, made e.g. of copper, does not provide sufficient heat sink capacity, it may well be conceivable to attach a further layer to the electrically conductive layer 26 acting as a heat sink.

In the stage shown in FIG. 2D the printed circuit board assembly 10 is in principle completed. However, it goes without saying that any further finishing steps may be provided as desired, e.g. providing soldering pads on the PCB surface or to PCB edges, applying solder resist to the PCB surface, or any other final finish as known.

The printed circuit board assembly 10 as described may be formed directly in any circuit board where a power semiconductor device is required, e.g. in a motherboard. However, a particular benefit is that using the process described a power semiconductor device of any configuration may be embedded in a semiconductor package which itself may be mounted to circuit boards including power conversion circuits. Such power semiconductor package is in principle the same as packages known as "multi-chip modules", and can be used as an integrated circuit component processable either via Surface Mount Technology (SMT) or via Through-Hole Mount Technology.

The description of the assembly of the printed circuit board assembly 10 above has been given with respect to a single printed circuit board assembly. However, it is possible to manufacture a plurality of printed circuit board assemblies 10 in parallel arranged on a larger substrate "wafer", and de-panelizing the individual printed circuit board assemblies to single modules or packages after the lamination and embedding process is finished. This allows a highly effective manufacturing with the possibility to test functionality of the individual modules or packages already before the de-panelizing step.

FIGS. 3A-3D show an alternative embodiment of a printed circuit board assembly 10 in different stages of the manufacturing process similar to the stages shown in FIGS. 2A to 2D. In FIGS. 3A to 3D, the same reference signs are used as in FIGS. 2A to 2D with respect to individual components having the same or corresponding function. In the following, description of FIGS. 3A to 3D is given only with respect to aspects that differ from the embodiment shown in FIGS. 2A to 2D. It is referred to the respective description of FIGS. 2A to 2D with respect to other aspects that do not differ from the embodiment shown in FIGS. 2A to 2D.

Figure 3A:
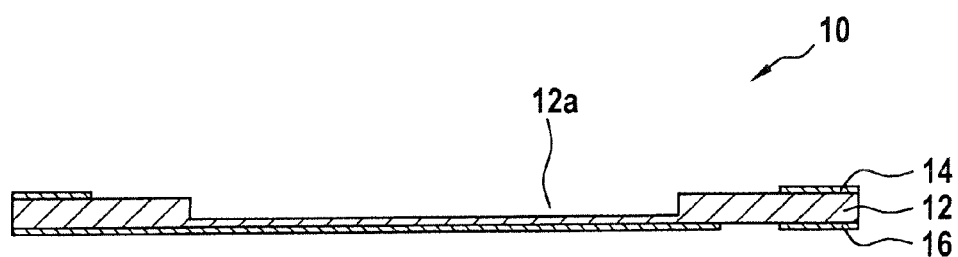
FIGS. 3A-3D show cross sectional views of a power semiconductor printed circuit board assembly according to a second embodiment.
Figure 3B:
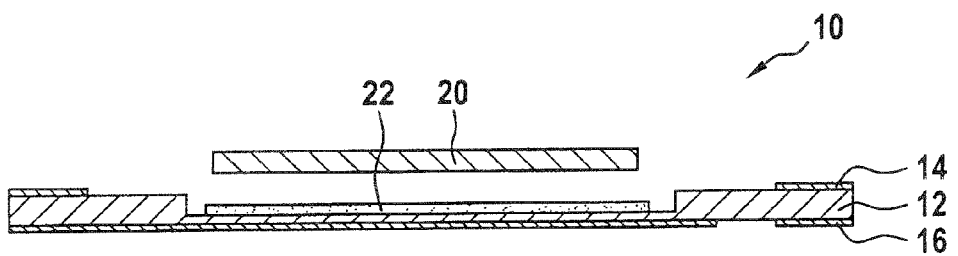

As shown in FIG. 3A, a cavity 12a is formed in the first core layer 12 before the power semiconductor device 20 is attached. The cavity 12a corresponds in size to the shape of power semiconductor device 20, such that power semiconductor device 20 can be accommodated in cavity 12a. As shown in FIG. 3B, power semiconductor device 20 is inserted into cavity 12a and attached to first core layer 12a via adhesive 22. As first core layer 12a is made from non-conductive material and bottom surface of power semiconductor device 20 does not come into contact with any of conductive layers 14, 16, adhesive 22 need not be an electrically conductive adhesive. Solder may used for attaching the power semiconductor device 22 to bottom of cavity 12a, but this is not mandatory for the same reason. Typically, a non-conductive adhesive will be used.

Figure 3C:
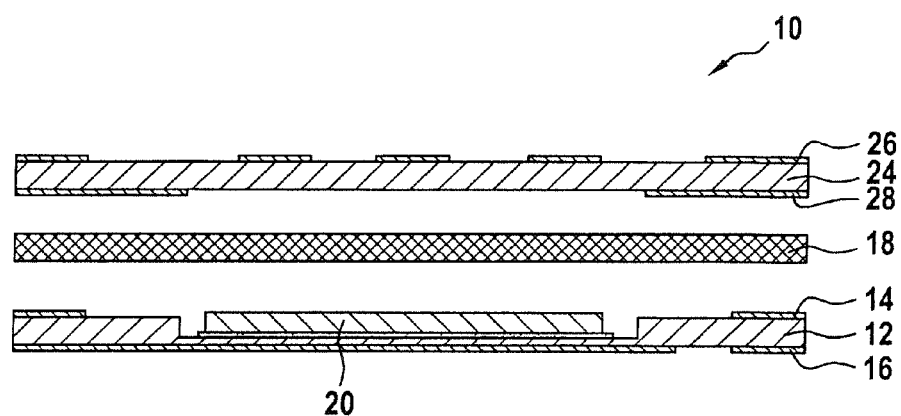
Figure 3D:
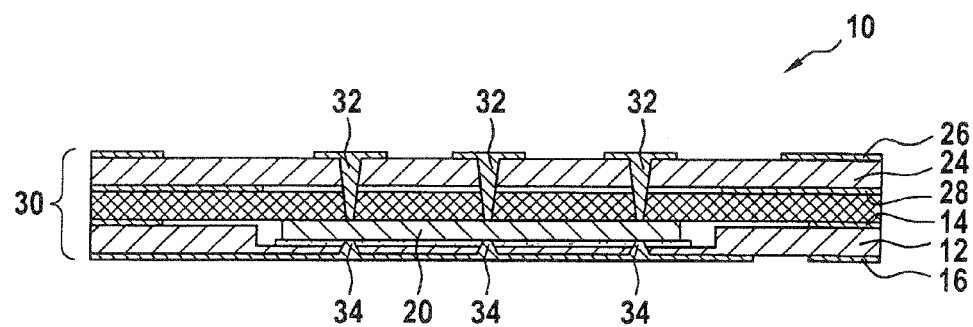

As shown in FIG. 3C, the upper side of power semiconductor device 22 is flush with the upper surface of first core layer 12 when the power semiconductor device is accommodated in cavity 12a. Therefore, only the upper surface of the power semiconductor device 20 is not embedded by the first core layer 12. Laminating layer 18 may be applied on top of the core layer 12 and the upper surface of the power semiconductor device 20.

Providing a cavity in the first core layer 12 has the advantage that positioning of the power semiconductor device 20 on the first core layer 12 is facilitated. As first core layer 12 typically is made from a rigid structured PCB material, or from a flex-rigid structured PCB material, it is can be machined relatively conveniently to form cavity 12a. In the following laminating steps, position of the power semiconductor device is well defined by the boundary of the cavity 12a.

In order to also allow electrical contacting the power semiconductor device via its lower surface, in this embodiment a number of second vias 34 are provided connecting the lower surface of the power semiconductor device 20 to the conductive layer 16 supported on the lower surface of the first core layer 12. Vias 34 may be provided using the same technology as the first vias 32 connecting the upper surface of the power semiconductor device 20 to the conductive layer 26 supported on the upper surface of the second core layer 24. See the description with respect to FIG. 2D for details.

The embodiments described provide an improved configuration for a power semiconductor module allowing more efficient assembly and/or better utilization of space while still providing sufficient heat dissipation capability.

One embodiment described herein relates to a printed circuit board assembly, comprising a printed circuit board having at least one conductive layer supported by a substrate layer, and at least one power semiconductor device. The at least one power semiconductor device is at least partly embedded in the substrate layer.

Compared to known technologies like Chip on Board or Power Component technologies, according to the embodiments described herein a further improvement in space utilization is achievable by transferring power semiconductor components and circuitry, usually attached to the surfaces of the printed circuit board (PCB), into an embedded PCB structure including the power semiconductor device as a part embedded in the PCB substrate. The power semiconductor device is suggested to be embedded directly in the substrate of a printed circuit board (PCB) within the course of the PCB manufacturing process, particularly within the framework of laminating different layers of a multilayer PCB together. Thereby, the PCB assembly including the PCB, the embedded power semiconductor device and any required electrical connections very much looks like a conventional PCB, once the PCB manufacturing process is finished. According to such configuration, the power semiconductor device does not require mounting space on the upper and lower mounting surfaces of the PCB and is well protected by the substrate layer of the PCB. This allows to utilise the available space on the mounting surfaces of the PCT more efficiently. Manufacturing efforts are also reduced, because wire bonding steps are unnecessary and it is no longer required to apply additional casting layers in order to protect wire bonds or semiconductor devices.

Embedding of the power semiconductor device in the substrate layer may be realized using PCB embedding technology as is applied in the manufacturing of PCB's in general. A number of known PCB embedding technologies may be applied, as well known in the art with respect to embedding of passive electrical components into the structures of, typically multi-layer, circuit boards, e.g. in the context of embedding capacitor structures in multi-layer circuit-boards made up from several layers of insulating or substrate material, possibly with layers of conductive material in between the substrate layers.

Building up the semiconductor device as an embedded structure within the substrate layer of a PCB also allows for testing functionality of the power semiconductor device and its electrical connections on the PCB assembly as a whole using standard testing procedures known from manufacturing of semiconductor packages. Once the PCB structure of the PCB assembly, including all the PCB layers and the embedded semiconductor device, has been build up, all electrical connections are set up as well and the PCB assembly is in principle ready to operate and therefore can be tested.

It is relatively straightforward to construct modular PCB assemblies using the configuration set out above. In this way, fully operative power semiconductor modules may be created as a result of mere PCB lamination steps. Such modules can be configured as Surface Mount Technology (SMT) processable PCB modules to be used in larger circuit designs. Through-Hole Mount Technology processable PCB modules may be created as well by additionally providing the PCB assembly with the respective leads.

It has turned out that sufficient heat dissipation can be realized using electrically conductive layers usually formed on the upper and/or lower faces of the PCB assembly. E.g. copper or silver structures may be provided on the upper and/or lower faces of the PCB assembly. Such structures are very efficient with respect to transport of heat, and may be thermally connected to the upper and lower faces of the power semiconductor device embedded in the PCB substrate, such as to act as heat sinks with respect to heat produced by the embedded power semiconductor device.

In particular embodiments, any of the following optional features may be realized. It goes without saying that any of these features may be realized in isolation or may be realized in connection with other features:

The power semiconductor device may be completely embedded in the substrate layer in the sense that all sides of the power semiconductor device are covered by the substrate layer. This configuration provides for best protection of the power semiconductor device, as the resulting PCB assembly does not have any sections where the power semiconductor device is exposed. The power semiconductor device may be arranged in a central position with respect to the thickness direction of the substrate layer, in particular centrally with respect to the stack of layers forming the substrate layer. In such configuration, the power semiconductor device is positioned close to the neutral layer of the PCB subject to minimum stress when bending the PCB. This improves reliability.

In particular, the power semiconductor device may be a semiconductor die, i.e. a "naked" semiconductor chip. A semiconductor chip is an electrical power component or integrated circuit build up on a semiconductor wafer, e.g. using MOSFET, IGBT, CMOS or other technology for constructing integrated circuits based on semiconductor wafers. The expression "naked" is understood in the sense that the semiconductor chip is in a state after dicing from a larger waver, but without applying any packaging or other back-end treatments.

Particular examples for power semiconductor devices include at least one of an insulated gate bipolar transistor (IGBT), a metal-oxide semiconductor field effect transistor (MOSFET), a thyristor, a Schottky diode, a power diode, or combinations thereof. In particular, the electrical power device may be an integrated circuit comprising any combination of these power semiconductor devices formed in semiconductor technology, e.g. using CMOS technology. Integrated circuit may include e.g. bridge circuits as used for power converters and/or power inverters, operating amplifier circuits, or other integrated circuits.

In most embodiments, the substrate layer will include an electrically insulating material. In particular, the substrate layer may be made from a main component of electrically insulating material. An electrically insulating material as used herein is non conductive with respect to electric current and also has a dielectric characteristics.

In particular, the substrate layer may have a multi-layer structure including a first core layer made of a thermally stable electrically insulating material, and further including a first laminating layer made of a thermally softening material. In such configuration, the power semiconductor device may be embedded by the first core layer and/or the first laminating layer. The substrate layer may include further core layers and/or laminating layers, as needed. The substrate may have a flexible rigid structure, as known for rigid-flex circuits being a hybrid construction flex circuit consisting of rigid and flexible layers which are laminated together into a single substrate structure.

For example, the first core layer may be made from insulating material known for producing printed circuit boards. Particular examples of such material are laminates made up with polytetrafluorethylene, FR-4 (epoxy resin matrix with woven glass filler), FR-1 (epoxy resin matrix with cellulose-paper filler), CEM-1 (epoxy resin matrix with woven glass filler), or CEM-3 (epoxy resin matrix with non-woven glass fillers). The first core layer may also be formed of, or at least include, materials as typically used for flex layers in rigid-flex circuits, e.g. a polyimide film layer. The first core layer may support one electrically conducting layer or may be sandwiched in between two electrically conducting layers. Typical PCB fabricates, e.g. in the form of a copper-clad laminate, may be used for the first core layer supporting a conducting layer or being sandwiched in between two conducting layers. The conduction layers may be planar conductive layers, or may have any desired patterning of electrically conductive traces, as is usually done with PCBs. Typical materials used for the conducting layers are copper, silver, or alloys including copper and/or silver.

In further embodiments, further conducting or non-conducting layers may be embedded in the core layer. For example, in high power applications, a thick electrically conductive layer may be included in the core layer in order to adjust the coefficient of thermal expansion CTE of the substrate layer to low enough values. Depending on the coefficient of thermal conduction, the additional layer may be used to transport heat efficiently away from the power semiconductor device.

The first laminating layer may have the configuration of a prepreg comprising a thermally softening plastics matrix material and a thermally stable inorganic filler material. The laminating layer thereby ensures tight lamination of the first core layer to further, conductive or non-conductive, substrate layers, if present, or to the at least one conductive layer supported by the substrate layer. As such, the first laminating layer has the characteristics of an adhesive which may be actived by temperature and/or pressure applied to the stack made of the laminating layer, the first core layer and potentially other layers, if present.

The laminating layer can be made from typical prepreg materials as used in semiconductor packaging. The filler material may be a fibrous material like fiber glass, cellulose fiber, cotton fiber. Typical matrix materials may be epoxy resin, phenolic resin, polyester. E.g. the laminate layer may be a prepreg made from FR-2 (phenolic resin matrix with cotton paper filler), FR-3 (epoxy resin matrix with cotton paper filler), FR-4 (epoxy resin matrix with woven glass filler), FR-4 (epoxy resin matrix with woven glass filler), FR-6 (polyester matrix with matte glass filler), G-10 (epoxy resin with woven glass filler), CEM-2 (epoxy resin with woven glass filler), CEM-3 (epoxy resin with non-woven glass filler), CEM-4 (epoxy resin matrix with woven glass filler), CEM-5 (polyester matrix with woven glass filler). Also, materials used for flex layers in hybrid-flex circuit board substrates, e.g. a polyimide film layer, may be used for the laminating layer.

In particular embodiments of the printed circuit board assembly, the power semiconductor device may be surface mounted to the first core layer, e.g. via solder, adhesive, or similar technique. This configuration allows the use of conventional PCBs for the first core layer, since except for the application of solder or adhesive, no further preparation of first core layer is necessary. The first core layer even may support a conductive layer, as usual for a PCB, in which case the power semiconductor device may be bonded to the conductive layer via solder, electrically conductive adhesive, or similar technique. Then, the conductive layer may be formed with a conductive pattern before applying the power semiconductor device to provide electrical contact to the power semiconductor device. Additionally, or alternatively, such conductive layer may also be used for transporting heat away from power semiconductor device efficiently, as the conductive layer is in direct thermal contact to the power semiconductor device.

The first laminating layer may be applied to the power semiconductor device and the first core layer in such configuration that faces of the power semiconductor device not bonded to the first core layer are embedded by first laminating layer. In a case where the power semiconductor device is surface mounted to the first core layer, only the lower side of the power semiconductor device will be embedded to the first core layer, but the other sides will remain exposed and should be embedded by the first laminating layer. To support embedding of the power semiconductor device by the material of the first laminating layer, the first laminating layer may be pre-formed with a cavity corresponding to the shape of the power semiconductor device.

In a further embodiment, the power semiconductor device may be mounted in a cavity formed in the first core layer. Typically, printed circuit board substrates are made from a material strong and rigid enough to allow machining. Thereby, in a first step a cavity may be formed in the first core layer for accommodating the power semiconductor device. This facilitates positioning of the power semiconductor device on the first core layer. Similar to the above surface mount configuration, the power semiconductor device may be bonded to the first core layer via solder, adhesive, or similar technique. Typically, an electrically conductive bonding will not be required, as the power semiconductor device will be bonded to the insulating material of the first core layer. However, it may be beneficial to use a bonding material allowing efficient transfer of heat.

The cavity formed in the first core layer may have a depth sufficiently large to fully, or at least substantially, accommodate the power semiconductor device in the cavity. In such configuration, the power semiconductor device may be embedded in the first core layer, except for the top face being still exposed. The top face of the power semiconductor device can be covered by the first laminating layer after the laminating layer has been bonded to the first core layer.

In cases where the depth of the cavity is smaller than the height of the power semiconductor device, the laminating layer may be pre-formed with a cavity corresponding to the shape of that portion of the semiconductor device which extends beyond the cavity formed in the first core layer. Although in such cases both the first core layer and the first laminating layer may have to be precute, in order to form the respective cavities therein, assembly may be facilitated since positioning of the first core layer relative to the first laminating layer is defined by the position of the cavities when the power semiconductor device is accommodated in the cavity.

In cases where the PCB assembly includes more than one power semiconductor device, it is well conceivable to have the a first one of the semiconductor devices surface mounted to the first core layer and to have another one of the power semiconductor devices mounted in a cavity formed within the first core layer.

In particular embodiments of the printed circuit board assembly, the substrate layer may comprise a first core layer, a first laminating layer, and a second core layer. Any of the materials and configurations described above for the first core layer apply to the second core layer as well. In particular, the first and second core layers may have an identical configuration. In such configuration with first and second core layers, the first and second core layers will be laminated on top of each other via the laminating layer. The first core layer or the second core layer may support the at least one conducting layer. It also conceivable that both the first and second core layers each support a respective conducting layer, typically on their sides facing away of each other. Moreover, the first core layer may support two conducting layers on its upper and lower sides, respectively, and in the same way also the second core layer may support two conducting layers on its upper and lower sides, respectively. A symmetrical structure of the PCB, in particular of the substrate layer, is typically beneficial as it reduces mechanical stress by the compensating action applied by the layers, e.g. by the first and second core layers.

Particularly, the at least one conductive layer may be electrically connected to a first side of the semiconductor device. Similarly, in order to enhance heat dissipation it may be beneficial to establish a good thermal connection between the at least one conductive layer and the first side of the semiconductor device.

In particular embodiments, the printed circuit board assembly further may comprise a second conductive layer electrically and/or thermally connected to a second side of the semiconductor device opposing the first side.

The printed circuit board assembly further may comprise at least one first via for establishing an electrical connection between the at least one conductive layer and the first side of the semiconductor device. The first via may also be configured to provide a sufficient thermal connection in order to allow the at least one conductive layer to act as heat sink with respect to the power semiconductor device. The via may have the configuration of a small opening or through hole formed by mechanical drilling or laser radiation in the insulating material of the first core layer and/or the laminating layer. The opening or through-hole may be made electrically conductive by electroplating an electrically conductive material, e.g. copper, or by lining the opening or through-hole with a tube or rivet of electrically conductive material. To enhance heat transfer characteristics, the via may be fully filled with an insert made of thermally conductive material. In one example, the via may be filled with copper or a copper based alloy. A plurality of first vias may be provided depending on the number of electrical connections required and/or depending on the heat transfer characteristics desired.

Further embodiments may comprise at least one second via electrically and/or thermally connecting the second conductive layer to the second side of the semiconductor device. The second vias may have the same, or similar, configuration as described with respect to the first vias above. In case the power semiconductor device is surface mounted to the first core layer via a conductive layer, such conductive layer may have a patterning, thus providing the same functionality as the second via. In such cases, the second via may not be necessary at all, or may be provided in order to support the conductive layer with respect to electrical connection and/or dissipation of heat.

In particular embodiments, the first and/or the second via may have the configuration of a microvia formed by laser radiation. Typically, vias in semiconductor packaging are formed by mechanically drilling through-holes or blind holes through insulating layers separating two or more conductive layers to be connected from each other. In a case where a semiconductor device or semiconductor die embedded in the substrate of a PCB is to be connected to an electrically conductive layer on the upper or lower surface of the substrate, it is more convenient to use laser radiation for drilling the blind hole required to form a via. By selecting the wavelength and/or the intensity of the laser light appropriately, it is possible to achieve significant absorption of laser energy by the substrate material (typically plastics or a plastics/fiber composite), but not by the metallic material forming the outer surface of a semiconductor die at a position where an electrical contact is to be made. Thereby, the laser will drill a hole only in the region of the substrate, but will not affect the semiconductor die. Once the hole has been drilled, it may be filled with an appropriate electrically and/or thermally conductive material to provide the desired via. Vias made in this way may have down to a tenth of a millimeter, but also larger diameters are possible by this technique, if desired.

As set out above, the printed circuit board assembly described herein is particularly well suited for producing a semiconductor chip module adapted to be mounted to a circuit board, in a way similar to "Multi Chip Modules". Such power semiconductor chip module may well be adapted to be mounted to a circuit board by surface mount technology (SMT), thus providing for a vey flexible and economic possibility to design more complex circuitry involving power semiconductor circuits. In particular, such power semiconductor chip module may be relatively easily replaced in case of damage, or in case modernization is desired, without having to modify the remaining circuits provided on the motherboard.

Alternatively to SMT technology, semiconductor modules may be provided being configured to be mounted by through mounting technology.

In some applications it may also be conceivable to form the printed circuit board assembly described above directly within a printed circuit board carrying further components and/or circuits, e.g. in a motherboard.

The printed circuit board assembly described above may include further electrically conductive or electrically non-conductive layers. In particular, it is well conceivable to apply further heat dissipating layers or heat sink layers on to the first and/or second electrically conductive layers. Moreover, the substrate layer may have the configuration of a laminate made up from further non-conductive and/or conductive layers. One example is a fuse layer which may be embedded in the substrate layer such as to be electrically contacted to the power semiconductor device and a ground plane. Another example is an electrical thick film layer integrated into the substrate layer in order to adjust the coefficient of thermal expansion of the substrate layer to a low value, such as to allow a higher maximum operating temperature. E.g. a metallic thick film made of Invar (an alloy having a composition Fe64Ni36) may be used which has a particularly low coefficient of thermal expansion.

Another embodiment relates to a method of manufacturing a printed circuit board assembly comprising a printed circuit board having at least one conductive layer supported by a substrate layer, and at least one power semiconductor device. The method comprises the step of embedding the at least one power semiconductor device at least partly in the substrate layer of the printed circuit board in the course of manufacturing the printed circuit board. As described above, the power semiconductor device, which in particular may be a power semiconductor die, may be embedded into the layer structure of the PCB during the manufacturing process of the PCB, using known technologies for embedding components into layer structures of PCB's. Particularly, it suggested to embed the power semiconductor device during the build up of multilayer PCB's having a configuration with a substrate layer made up from at least two non-conductive layers laminated together to form the substrate layer. The non-conductive layers may be core layers or laminating layers, as described above. In a particular embodiment, two core layers may be provided which are laminated together using a laminating layer. Optionally, the core layers may support a conductive layer on one or both of their surfaces. The power semiconductor device may be embedded in such structure in the course of laminating the core layers to form the substrate layer, as described above.

What is claimed is:

1. A printed circuit board assembly, comprising a printed circuit board having at least one conductive layer supported by a substrate layer, and at least one power semiconductor device, wherein the at least one power semiconductor device is embedded in the substrate layer, wherein the power semiconductor device includes at least one of an insulated gate bipolar transistor power diode (IGBT), a metal-oxide semiconductor field effect transistor (MOSFET), a thyristor, a Schottky diode, a power diode, or combinations thereof, wherein the substrate layer includes a first core layer made of a thermally stable electrically insulating material, and further includes a first laminating layer made of a thermally softening material, the power semiconductor device being embedded by the first core layer and/or the first laminating layer.

2. The printed circuit board assembly according to claim 1, wherein the power semiconductor device is completely embedded in the substrate layer.

3. The printed circuit board assembly according to claim 1, wherein the power semiconductor device is a semiconductor die.

4. The printed circuit board assembly according to claim 1, wherein the first laminating layer has the configuration of a prepreg comprising a thermally softening plastics matrix material and a thermally stable inorganic filler material.

5. The printed circuit board assembly according to claim 1, wherein the power semiconductor device is surface mounted to the first core layer.

6. The printed circuit board assembly according to claim 1, wherein the power semiconductor device is mounted in a cavity formed in the first core layer.

7. The printed circuit board assembly according to claim 1, wherein the substrate layer comprises the first core layer, the first laminating layer, and a second core layer, the first and second core layers laminated on top of each other via the laminating layer, the first core layer and/or the second core layer supporting the at least one conducting layer.

8. The printed circuit board assembly according to claim 1, wherein the at least one conductive layer is electrically connected and/or thermally connected to a first side of the power semiconductor device.

9. The printed circuit board assembly according to claim 8, further comprising a second conductive layer electrically and/or thermally connected to a second side of the power semiconductor device opposing the first side.

10. The printed circuit board assembly according to claim 8, further comprising at least one first via electrically and/or thermally connecting the first conductive layer to the first side of the power semiconductor device, and/or comprising at least one second via electrically and/or thermally connecting the second conductive layer to the second side of the power semiconductor device.

11. The printed circuit board assembly according to claim 10, wherein the first and/or the second via has the configuration of a microvia formed by laser radiation.

12. A semiconductor chip module comprising the printed circuit board assembly according to claim 1, the semiconductor chip module adapted to be mounted to a circuit board.

13. A method of manufacturing a printed circuit board assembly comprising a printed circuit board having at least one conductive layer supported by a substrate layer, and at least one power semiconductor device, the method comprising:

embedding the at least one power semiconductor device in the substrate layer of the printed circuit board in the course of manufacturing the printed circuit board.

* * * * *